US006989699B2

(12) United States Patent
Märzinger

(10) Patent No.: US 6,989,699 B2
(45) Date of Patent: Jan. 24, 2006

(54) PHASE DETECTION CIRCUIT HAVING A SUBSTANTIALLY LINEAR CHARACTERISTIC CURVE

(75) Inventor: Günter Märzinger, Ulrichsberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/769,464

(22) Filed: Jan. 29, 2004

(65) Prior Publication Data

US 2004/0183571 A1 Sep. 23, 2004

(30) Foreign Application Priority Data

Jan. 31, 2003 (DE) ............................... 103 03 939

(51) Int. Cl.
*H03L 7/06* (2006.01)
(52) U.S. Cl. ...................................... 327/157; 327/148
(58) Field of Classification Search ........ 327/154–157, 327/163, 146–148, 535–538, 540, 541, 543
See application file for complete search history.

(56) References Cited

U.S. PATENT DOCUMENTS

| 5,208,546 | A | * | 5/1993 | Nagaraj et al. ............. 327/157 |
| 5,432,481 | A | * | 7/1995 | Saito ............................ 331/45 |
| 5,699,387 | A | * | 12/1997 | Seto et al. .................. 375/376 |
| 6,002,273 | A | | 12/1999 | Humphreys ..................... 327/3 |
| 6,222,401 | B1 | * | 4/2001 | Yoon .......................... 327/156 |
| 6,407,619 | B1 | * | 6/2002 | Tanaka ....................... 327/536 |
| 6,535,051 | B2 | * | 3/2003 | Kim .......................... 327/536 |
| 6,756,830 | B1 | * | 6/2004 | Wyszynski .................. 327/157 |

FOREIGN PATENT DOCUMENTS

| DE | 43 42 344 A1 | 6/1995 |
| EP | 0 458 269 A1 | 11/1991 |

* cited by examiner

*Primary Examiner*—Tuan T. Lam
*Assistant Examiner*—Hai L. Nguyen
(74) *Attorney, Agent, or Firm*—Eschweiler & Associates, LLC

(57) ABSTRACT

A circuit for phase detection includes two current sources controlled by a phase detector. One of the current sources has a reference current input that is connectable to a first or second reference current source in response to the phase detector.

18 Claims, 2 Drawing Sheets

PHASE DETECTION CIRCUIT HAVING A SUBSTANTIALLY LINEAR CHARACTERISTIC CURVE

FIELD OF THE INVENTION

The present invention relates to a circuit arrangement having a phase detector and also to a phase locked loop having said circuit arrangement.

BACKGROUND OF THE INVENTION

Phase detectors are normally suitable for comparing the phase angles of two signals (which are present at inputs of the phase detector) with one another, ascertaining a phase deviation which possibly exists between the two input signals and supplying a signal at their output, said signal being either proportional to or at least dependent on the phase difference between the input signals.

Phase detectors are used, for example, in phase locked loops in order to lock a signal (which is to be generated) at the desired frequency onto a reference signal source. Phase locked loops may be used to generate highly precise signals with high frequency stability by establishing reference to a reference source, for example a crystal oscillator. In this case, however, the frequency generated may be different from the reference frequency. A frequency divider is normally provided for this in the feedback path of the phase locked loop.

In order to achieve carrier modulation in digital communications applications as early as during generation of the frequency in the phase locked loop, developments of the phase locked loop provide a so-called fractional-N frequency divider in the feedback path from the oscillator to the phase detector, it being possible to use said frequency divider to set fractional divider ratios, averaged over one time interval. Phase locked loops of this type may be driven, for example, by a digitally coded modulation signal via so-called $\Sigma\Delta$ converters. The signal, which has been provided at the output by a phase detector and is dependent on the phase difference between the input signals, is normally passed to a charge pump output, which generates an upward or downward current, which in turn is normally integrated and, once converted into a corresponding control voltage, controls a controllable oscillator in such a manner that the phase difference at the input of the detector becomes smaller until it disappears.

Phase detectors of this type which can take into account not only a phase difference but also a frequency difference when comparing the input signals are referred to as phase-frequency detectors.

FIG. 3 shows a conventional phase detector arrangement. If, in the charge pump output stage 9', 13' of a phase detector 1, the upward and downward current sources 9', 13' do not supply an ideally identical current upon respective activation, a bend disadvantageously results at the origin of the family of characteristic curves of the charge pump phase detector unit, the average output current being plotted against the phase deviation of the input signals of the detector as characteristic curve in FIG. 4. However, since the origin, at which the characteristic curve bends, corresponds to the operating point of the phase detector, an undesirable nonlinearity results at the operating point. However, particularly in the case of the above-described fractional-N phase locked loops, fractional-N PLLs for short, a highly linear relationship between the output current of the phase detector and the phase difference between the input signals is of particularly significant importance for reliable operation of the circuit.

The document U.S. Pat. No. 6,002,273 specifies one option for shifting the described bend in the characteristic curve of the charge pump phase detector block out of the operating point of this circuit unit. For this purpose, in addition to the two current sources which are normally present and are intended for generating an upward current and a downward current, a third current source is provided there for the purpose of linearization. However, this additional, third current source in the output stage of the phase detector, the so-called charge pump, signifies additional complexity in the integration of the circuit, in particular an additional chip area and current requirement. However, this is undesirable particularly since phase locked loops are often used in mobile devices, for example radio plug-in cards, mobile telephones or cordless telephones, in which importance is attached to small dimensions, low fabrication costs in mass production and a low current requirement.

It is an object of the present invention to specify a circuit arrangement having a phase detector and also a phase locked loop having said circuit arrangement, which circuit arrangement and phase locked loop provide a highly linear characteristic curve between the output current of the phase detector and the phase difference between the input signals and at the same time may be implemented with relatively low complexity.

SUMMARY OF THE INVENTION

A circuit arrangement includes:
a phase detector, which has a first input for supplying an input signal having a first phase angle and a second input for supplying an input signal having a second phase angle,
an output stage, which has a first current source and a second current source,
a first switch for driving the first current source, said switch coupling a reference current input of the current source either to a first reference current source or to a second reference current source and having a control input, which is connected to a first output of the phase detector,
a second switch, which is coupled to the second current source for the purpose of connecting and disconnecting the latter and has a control input, which is connected to a second output of the phase detector, and
a signal output of the circuit arrangement, said signal output being coupled to the first and the second current source and being designed for the purpose of providing an output current in a manner dependent on a phase deviation between the first and the second phase angle of the input signals of the phase detector.

In accordance with the proposed principle, one of the two current sources of the charge pump output stage of the phase detector is equipped with a reference current supply, which can be switched over. The operating point of the phase detector circuit is thus advantageously shifted out of the origin of the characteristic curve representing the output current plotted against the phase difference between the input signals. Since the circuit in accordance with the present principle can operate without a third current source, it is advantageously possible to implement the circuit with a small chip area and to operate it with a low current requirement.

To summarize, the proposed principle achieves the advantageous effect of shifting the operating point merely by switching over the reference current from one of the two current sources. It is thus advantageously possible to dispense with an offset current source for the purpose of shifting the operating point.

In accordance with a preferred development of the proposed principle, the first and second current sources are connected to one another, in the output stage of the circuit arrangement having a phase detector, in order to form a series circuit, and the series circuit is connected between a supply potential terminal and a reference potential terminal of the circuit arrangement. In this case, the current source facing the positive supply terminal preferably operates as a so-called upward current source, which upon activation drives a positive current out of the signal output of the circuit arrangement, and the current source facing the more negative supply terminal preferably operates as a current sink, that is to say there is a negative flow of current out of the signal output of the circuit.

The second switch, which is assigned to the second current source, is preferably either provided in a series circuit between the signal output of the circuit and a supply or reference potential terminal assigned to the current source. Alternatively, for the purpose of connecting and disconnecting the second current source, the second switch is not connected into the load circuit of the latter but rather is designed to control the reference circuit, which is assigned to the second current source and drives the latter.

In order to be able to provide precise currents using current sources of a charge pump circuit, said current sources are normally driven using a bias or reference current. The entire current source can preferably be switched on and off by connecting and disconnecting the reference current.

A phase locked loop, having a circuit arrangement as described above, also includes:
  a controlled oscillator, which has a control input, which is connected to the signal output of the circuit arrangement having a phase detector via a loop filter, and an output,
  a frequency divider, which couples the output of the controlled oscillator to the first input of the phase detector, and
  a reference frequency generator, which is coupled to the second input of the phase detector.

The advantages of the described phase detector circuit having a charge pump output stage are particularly advantageously applicable when used in a PLL, Phase Locked Loop, since in this case a linear relationship between the output current of the phase detector and the phase difference between the input signals, in particular at the operating point of the arrangement, is particularly important.

The frequency divider is preferably in the form of a fractional-N divider, and the phase locked loop is therefore suitable for operation as a ΣΔ modulator in accordance with digital modulation methods.

BRIEF DESCRIPTION OF THE DRAWINGS

The invention is explained in more detail below using a plurality of exemplary embodiments and with reference to the drawings, in which.

DETAILED DESCRIPTION

Figure 1:
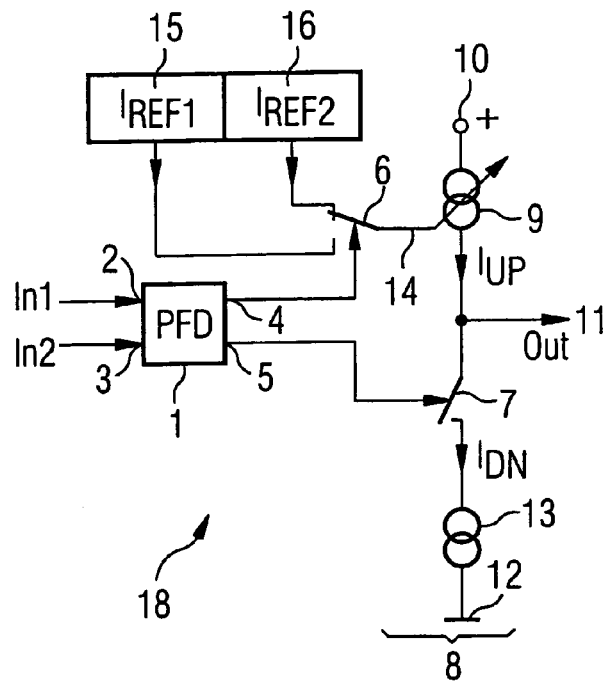
FIG. 1 shows a first exemplary embodiment of a circuit arrangement having a phase detector in accordance with the proposed principle.
Figure 2:
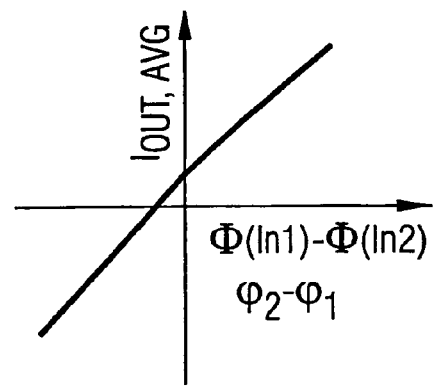
FIG. 2 shows the characteristic curve of the phase detector shown in FIG. 1.

Reference symbols in the drawings are:
1 Phase detector
2 Input
3 Input
4 Output
5 Output
6 Switch
7 Switch
8 Output stage/charge pump
9 Current source
10 Supply potential terminal
11 Signal output
12 Reference potential terminal
13 Current source
14 Reference current input
15 Reference current source
16 Reference current source
17 Reference current source
18 Phase detector having a charge pump output
19 Crystal oscillator
20 Loop filter
21 Voltage-controlled oscillator
22 Fractional-N frequency divider
23 ΣΔ converter FIG. 1 shows a circuit arrangement having a phase detector in accordance with the proposed principle. The phase detector 1 is in the form of a phase-frequency detector and comprises an input 2 for supplying an input signal (IN1) having a first phase angle (Φ1) and also a further input 3 for supplying an input signal (IN2) having a second phase angle (Φ2). Two outputs are provided at the output of the phase detector 1, an upward control signal being provided at a first output 4 and a downward control signal being provided at a second output 5 in a manner dependent on a phase difference (Φ2−Φ1) between the input signals (IN1, IN2) at the inputs (2, 3) of the detector 1. The output 4 of the phase detector is connected to the control input of a first switch 6 and the output 5 of the phase detector is connected to the control input of a second switch 7. The switches 6, 7 are used to control current source branches of a charge pump output stage 8 of the circuit arrangement having a phase detector as shown in FIG. 1. A first current source 9, which operates as an upward current source of the charge pump 8, is connected between a positive supply potential terminal 10 and the signal output 11 of the circuit arrangement. A series circuit comprising the switch 7 and a second current source 13, which is in the form of a downward current source of the charge pump 8 and operates as a current sink, is connected between the signal output 11 and a reference potential terminal 12 of the circuit arrangement. The first current source 9 has a reference current input 14, to which a reference current required for operating the current source is supplied. The output current of the first current source 9, said current being provided with the reference symbol $I_{UP}$, is in this case dependent on the reference current fed in at the input 14. The reference current input 14 is applied to a load terminal of the switch 6 and is permanently connected thereto. The switch 6 is in the form of a changeover switch and is connected by a further load terminal either to a first reference current source 15 or to a second reference current source 16. The reference current sources 15, 16 are designed to provide fixed but different reference currents $I_{REF1}$, $I_{REF2}$.

Since, in accordance with the driving and connection of the switch 6 to the quiescent current input or reference current input of the current source 9 and to the two current sources 15, 16 for providing reference currents, the current source 9 is never completely switched off but always supplies a certain magnitude of current to the signal output 11, it is ensured that the characteristic curve of the phase detector, namely of the output current $I_{OUT}$ plotted against the phase difference $\Phi2-\Phi1$ at the input of the detector 1, does not run through the origin, that is to say through the zero point. This in turn means that the operating point of the phase detector arrangement of FIG. 1 is not situated at a bend (which is possibly present) in the characteristic curve, said bend occurring when the current sources 9, 13 do not supply an ideally identical magnitude of current.

In accordance with the proposed circuit of FIG. 1, only one upward current source 9 and one downward current source 13 are provided in the output stage 8 of the charge pump circuit of the phase detector arrangement. It is possible to dispense with a third current source (in the form of a constant current source) in the output stage. As a result, the area requirement of the circuit is low.

Figure 3:
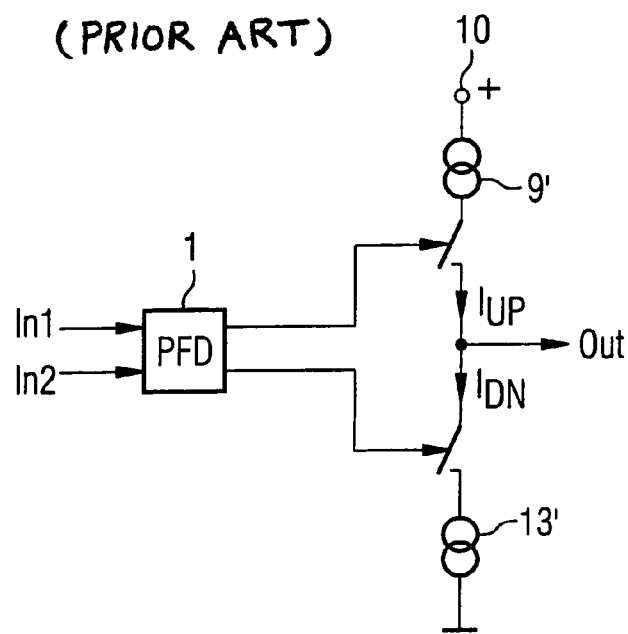
FIG. 3 shows a conventional phase detector having a charge pump output in accordance with the prior art.
Figure 4:
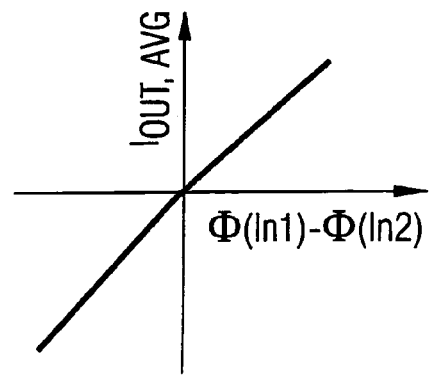
FIG. 4 shows the characteristic curve of the phase detector of FIG. 3.

The circuit shown in FIG. 3 having the associated characteristic curve shown in FIG. 4 has already been explained at the outset and shall therefore not be described again at this juncture.

Figure 5:
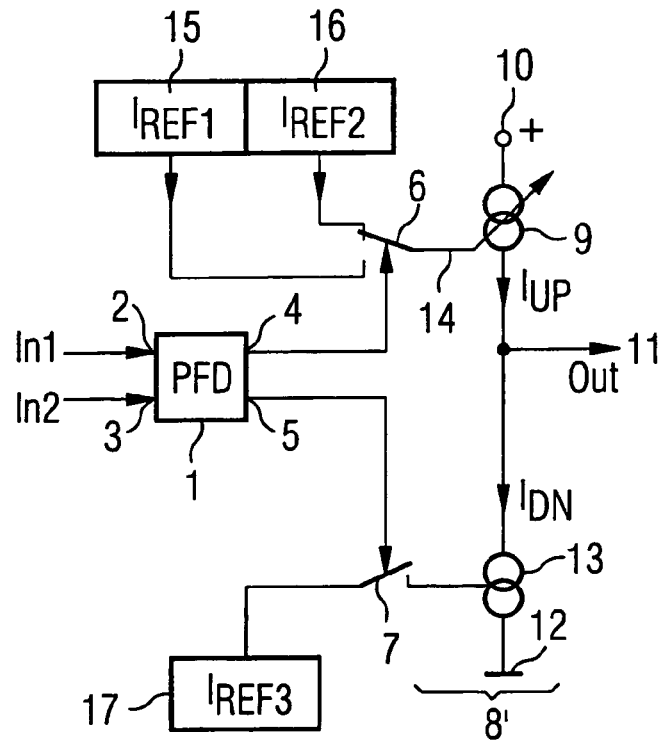
FIG. 5 shows, with the aid of a circuit diagram, a second exemplary embodiment of a phase detector circuit in accordance with the proposed principle.

FIG. 5 shows an alternative embodiment of the circuit arrangement having a phase detector as shown in FIG. 1. Identical reference symbols designate identical or identically acting circuit parts. In terms of its structure and advantageous operation, the circuit of FIG. 5 largely corresponds to that of FIG. 1 and differs only in that the switch 7 is not connected in series with the second current source 13 in the load circuit but rather is connected into the reference current supply of the second current source 13. On the load side, the switch 7 connects a third reference current source 17 to a reference current input of the second current source 13. The control input of the second switch 7 is connected to the second output 5 of the phase detector 1. On the load side, the second current source 13 is now connected directly between the signal output 11 and the reference potential terminal 12. As regards the output stage 8', the circuit of FIG. 5 has greater symmetry than the circuit of FIG. 1.

Figure 6:
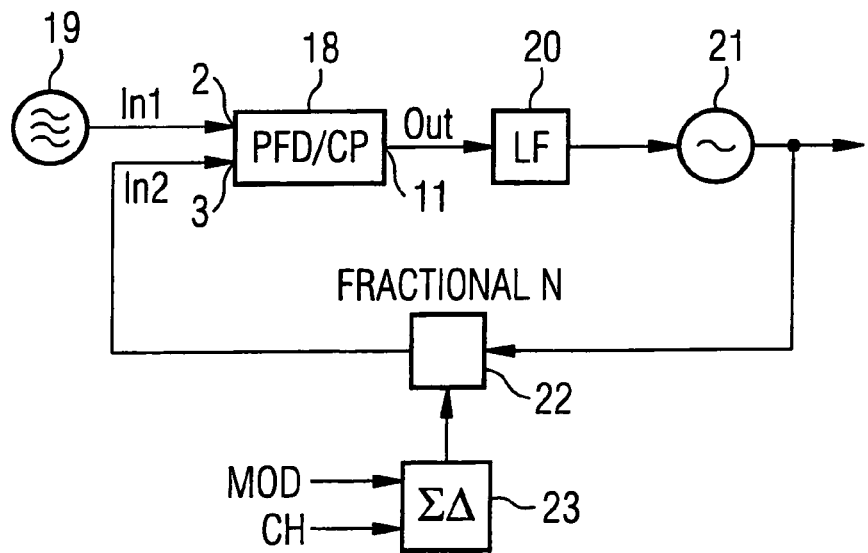
FIG. 6 shows, with the aid of an exemplary block diagram, a phase locked loop having a phase detector circuit as shown in FIG. 1 or 5.

FIG. 6 shows a fractional-N PLL having a circuit arrangement 18 having a phase detector 1 as shown in FIG. 1. The input 2 of the circuit arrangement having a phase detector 18 of FIG. 1 is connected to a crystal oscillator 19. The control input of a voltage-controlled oscillator 21 is connected to the output 11 of the circuit arrangement 18 via a loop filter 20, which stabilizes the control loop. The output of the oscillator 21 firstly forms the output of the entire phase locked loop and is moreover connected, via a fractional-N frequency divider 22, to the further input 3 of the circuit arrangement 18 having a phase detector and a charge pump output stage. The fractional-N frequency divider 22 is driven, via a sigma-delta $\Sigma\Delta$ converter 23, by a modulation signal MOD and a signal for channel preselection CH.

The principle of the present invention, namely that of achieving, at the operating point of the phase detector, a highly linear relationship between the output current of the latter and the phase difference between the two input signals with a low level of complexity and at the same time occupying a small chip area, is particularly advantageously applicable in the fractional-N phase locked loop described.

Although exemplary embodiments of the invention are described above in detail, this does not limit the scope of the invention, which can be practiced in a variety of embodiments.

What is claimed is:

1. A circuit for phase detection, comprising:
a phase detector including a first input for receiving a first input signal having a first phase angle, and a second input for receiving a second input signal having a second phase angle, said phase detector having first and second outputs;
first and second current sources, the first current source including a reference current input;
first and second reference current sources;
a first switch coupled to the reference current input of the first current source and also coupled to the first or second reference current sources, said first switch for coupling the reference current input of the first current source to one of the first and second reference current sources, wherein a current associated with the first current source always maintains a nonzero value during operation of the phase detection circuit, the first switch having a control input connected to the first output of the phase detector;
a second switch coupled to the second current source for connecting and disconnecting the second current source to and from a predetermined node, the second switch having a control input connected to the second output of the phase detector; and
a signal output coupled to the first and second current sources for providing an output current based on a phase deviation between the first and second phase angles.

2. The circuit of claim 1, wherein the predetermined node is the signal output.

3. The circuit of claim 1, including a third reference current source, the second current source having a reference current input, and the second switch coupled between the third reference current source and the reference current input of the second current source for connecting the disconnecting the third reference current source and the reference current input of the second current source.

4. The circuit of claim 1, including a supply potential terminal and a reference potential terminal, the first and second current sources arranged in series configuration between the supply potential terminal and the reference potential terminal.

5. The circuit of claim 4, wherein the predetermined node is the signal output.

6. The circuit of claim 4, including a third reference current source, the second current source having a reference current input, and the second switch coupled between the third reference current source and the reference current input of the second current source for connecting and disconnecting the third reference current source and the reference current input of the second current source.

7. A phase locked loop circuit, comprising:
- a phase detector including a first input for receiving a first input signal having a first phase angle, and a second input for receiving a second input signal having a second phased angle, said phase detector having first and second outputs;
- first and second current sources, the first current source including a reference current input;
- first and second reference current sources;
- a first switch coupled to the reference current input of the first current source and also coupled to the first or second reference current sources, said first switch for coupling the reference current input of the first current source to one of the first and second reference current sources, wherein a current associated with the first current source always maintains a nonzero value during operation of the phase detection circuit, the first switch having a control input connected to the first output of the phase detector;
- a second switch coupled to the second current source for connecting and disconnecting the second current source to and from a predetermined node, the second switch having a control input connected to the second output of the phase detector;
- a signal output coupled to the first and second current sources for providing an output current based on a phase deviation between the first and second phase angles;
- a controlled oscillator having a control input and an output;
- a loop filter connected between the signal output and the control input of the controlled oscillator;
- a frequency divider coupled between the output of the controlled oscillator and the first input of the phase detector; and
- a reference frequency generator coupled to the second input of the phase detector.

8. The circuit of claim 7, including a supply potential terminal and a reference potential terminal, the first and second current sources arranged in series configuration between the supply potential terminal and the reference potential terminal.

9. The circuit of claim 8, wherein the predetermined node is the signal output.

10. The circuit of claim 9, wherein the frequency divider includes a fractional-N divider having a control input for receiving a conditioned modulation signal.

11. The circuit of claim 8, wherein the frequency divider includes a fractional-N divider having a control input for receiving a conditioned modulation signal.

12. The circuit of claim 8, including a third reference current source, the second current source having a reference current input, and the second switch coupled between the third reference current source and the reference current input of the second current source for connecting and disconnecting the third reference current source and the reference current input of the second current source.

13. The circuit of claim 12, wherein the frequency divider includes a fractional-N divider having a control input for receiving a conditioned modulation signal.

14. The circuit of claim 7, wherein the frequency divider includes a fractional-N divider having a control input for receiving a conditioned modulation signal.

15. The circuit of claim 7, wherein the predetermined node is the signal output.

16. The circuit of claim 15, wherein the frequency divider includes a fractional-N divider having a control input for receiving a conditioned modulation signal.

17. The circuit of claim 7, including a third reference current source, the second current source having a reference current input, and the second switch coupled between the third reference current source and the reference current input of the second current source for connecting and disconnecting the third reference current source and the reference current input of the second current source.

18. The circuit of claim 17, wherein the frequency divider includes a fractional-N divider having a control input for receiving ac conditioned modulation signal.

* * * * *

UNITED STATES PATENT AND TRADEMARK OFFICE
CERTIFICATE OF CORRECTION

PATENT NO. : 6,989,699 B2 Page 1 of 1
DATED : January 24, 2006
INVENTOR(S) : Günter Märzinger It is certified that error appears in the above-identified patent and that said Letters Patent is hereby corrected as shown below:

<u>Column 6,</u>
Lines 44-67, replace with:
-- 2.    The circuit of Claim 1, including a supply potential terminal and a reference potential terminal, the first and second current sources arranged in series configuration between the supply potential terminal and the reference potential terminal.

3.    The circuit of Claim 2, wherein the predetermined node is the signal output.

4.    The circuit of Claim 2, including a third reference current source, the second current source having a reference current input, and the second switch coupled between the third reference current source and the reference current input of the second current source for connecting and disconnecting the third reference current source and the reference current input of the second current source.

5.    The circuit of Claim 1, wherein the predetermined node is the signal output.

6.    The circuit of Claim 1, including a third reference current source, the second current source having a reference current input, and the second switch coupled between the third reference current source and the reference current input of the second current source for connecting the disconnecting the third reference current source and the reference current input of the second current source. --.

Signed and Sealed this

Thirteenth Day of June, 2006

JON W. DUDAS
*Director of the United States Patent and Trademark Office*